(12) United States Patent
Baroky et al.

(10) Patent No.: US 7,736,020 B2
(45) Date of Patent: Jun. 15, 2010

(54) ILLUMINATION DEVICE AND METHOD OF MAKING THE DEVICE

(75) Inventors: Tajul Arosh Baroky, Penang (MY); Janet Bee Yin Chua, Perak (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 409 days.

(21) Appl. No.: 11/454,566

(22) Filed: Jun. 16, 2006

(65) Prior Publication Data

US 2007/0291482 A1 Dec. 20, 2007

(51) Int. Cl.
*F21S 4/00* (2006.01)
(52) U.S. Cl. .................. 362/249.02; 362/245; 362/650
(58) Field of Classification Search .......... 362/227, 362/234–237, 240, 241, 243–245, 249, 294, 362/341, 347, 350, 360, 361, 363, 373, 800, 362/806, 809; 313/498, 500, 634, 636; 361/760, 361/717–723, 805, 806
See application file for complete search history.

(56) References Cited

U.S. PATENT DOCUMENTS

| | | | |
|---|---|---|---|
| 4,729,061 A | 3/1988 | Brown | |
| 4,742,432 A * | 5/1988 | Thillays et al. | 361/783 |
| 5,119,174 A | 6/1992 | Chen | |
| 5,467,252 A | 11/1995 | Nomi et al. | |
| 5,585,783 A * | 12/1996 | Hall | 340/473 |
| 5,806,965 A * | 9/1998 | Deese | 362/249 |
| 6,428,189 B1 | 8/2002 | Hochstein | |
| 6,499,860 B2 * | 12/2002 | Begemann | 362/230 |
| 6,525,668 B1 * | 2/2003 | Petrick | 340/815.45 |
| 6,709,132 B2 * | 3/2004 | Ishibashi | 362/249 |
| 6,730,533 B2 * | 5/2004 | Durocher et al. | 438/26 |
| 6,848,819 B1 * | 2/2005 | Arndt et al. | 362/545 |
| 6,921,183 B2 | 7/2005 | Yang et al. | |
| 6,999,318 B2 | 2/2006 | Newby | |
| 7,008,079 B2 | 3/2006 | Smith | |
| 7,011,430 B2 | 3/2006 | Chen | |
| 7,086,756 B2 * | 8/2006 | Maxik | 362/249 |
| 7,086,767 B2 * | 8/2006 | Sidwell et al. | 362/545 |
| 7,095,053 B2 | 8/2006 | Mazzochette et al. | |
| 7,196,459 B2 | 3/2007 | Morris | |
| 7,218,041 B2 | 5/2007 | Isoda | |
| 7,285,802 B2 | 10/2007 | Ouderkirk et al. | |
| 7,319,293 B2 * | 1/2008 | Maxik | 313/636 |
| 7,329,942 B2 | 2/2008 | Tsou et al. | |
| 7,436,000 B2 | 10/2008 | Kim et al. | |
| 2007/0018558 A1 | 1/2007 | Chua et al. | |

* cited by examiner

*Primary Examiner*—Hargobind S Sawhney

(57) ABSTRACT

An illumination device and method of making the device uses a three-dimensional (3D) substrate on which a number of light-emitting dies are mounted. The 3D substrate is configured to define an interior region. The illumination device includes electrical traces on at least one of the exterior surface and the interior surface of the 3D substrate.

17 Claims, 4 Drawing Sheets

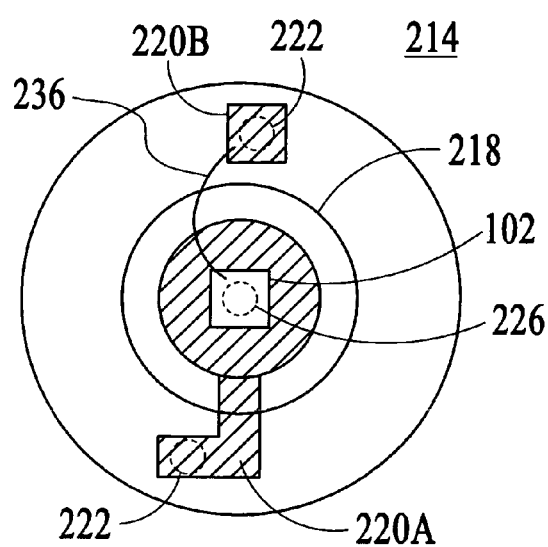
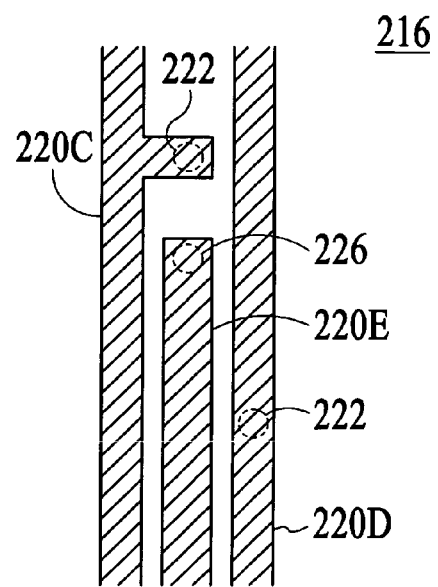
FIG.3A  FIG.3B
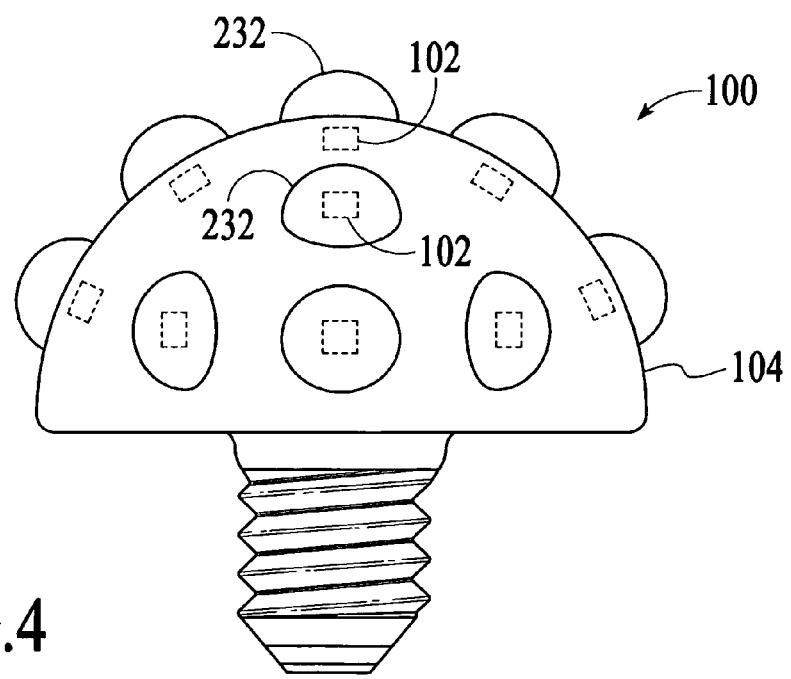
FIG.4

ILLUMINATION DEVICE AND METHOD OF MAKING THE DEVICE

BACKGROUND OF THE INVENTION

Light emitting diodes ("LEDs") have many advantages over conventional light sources, such as incandescent, halogen and fluorescent lamps. These advantages include longer operating life, lower power consumption and smaller size. Consequently, conventional light sources are increasingly being replaced with LEDs in traditional lighting applications. As an example, LEDs are currently being used in light bulbs, flashlights, traffic signal lights, automotive exterior and interior lights and display devices.

A typical LED includes an LED die mounted on a substrate, such as a leadframe, and encapsulated in a molded transparent lamp package. Since the light output of an LED is limited, the LED die may be mounted in a reflector cup formed on the substrate to collect the light emitted by the LED die and direct the light upward toward the top of the transparent lamp package. Moreover, the transparent lamp package of the LED may have a domed top, which functions as a lens to focus the light emitted from the LED die.

LED-based illumination devices have been developed that use a number of LEDs to produce sufficient light output comparable to conventional light sources. The LEDs are electrically and structurally attached to a printed circuit board (PCB), which includes circuits to provide driving signals to the LEDs. The light from each LED is emitted in a substantially narrow field of view in a direction perpendicular to the surface of the PCB. Thus, the combined light from all the LEDs has a small angle of illumination. However, there is a need for a light source that provides a wider angle of illumination, and even a spherical illumination. Consequently, some LED-based illumination devices include a spherical cover that scatters the light from the LEDs to produce a wider angle of illumination.

However, these LED-based illumination devices can at best produce a hemispheric illumination. Furthermore, the intensity of light from such an LED-based illumination device tends to be non-uniform. Thus, what is needed is an LED-based illumination device that can provide a wide angle of uniform illumination.

SUMMARY OF THE INVENTION

An illumination device and method of making the device uses a three-dimensional (3D) substrate on which a number of light-emitting dies are mounted. The 3D substrate is configured to define an interior region. The illumination device includes electrical traces on at least one of the exterior surface and the interior surface of the 3D substrate. Since the light-emitting dies are mounted on the 3D substrate, the illumination device can provide a multi-directional illumination, i.e., light emission in different directions.

An illumination device in accordance with an embodiment of the invention comprises a 3D substrate having an exterior surface and an interior surface configured to define an interior region, a plurality of electrical traces on at least one of the exterior surface and the interior surface, and a plurality of light-emitting dies mounted on the exterior surface of the 3D substrate and connected to some of the electrical traces. The light-emitting dies are configured to generate light when driving signals are applied to the light-emitting dies through the electrical traces.

A method of making an illumination device in accordance with an embodiment of the invention comprises forming a three-dimensional substrate with an interior region, the three-dimensional substrate having an exterior surface and an interior surface, forming a plurality of electrical traces on at least one of the exterior surface and the interior surface, and mounting a plurality of light-emitting dies on the exterior surface of the three-dimensional substrate, including electrically connecting the light-emitting dies to some of the electrical traces.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 3A is a partial view of the exterior surface of a three-dimensional (3D) substrate, which is part of the illumination device of FIG. 1.

FIG. 3B is a partial view of the interior surface of the 3D substrate

FIG. 4 is a diagram of an illumination device in accordance with an alternative embodiment of the invention.

DETAILED DESCRIPTION

Figure 1:
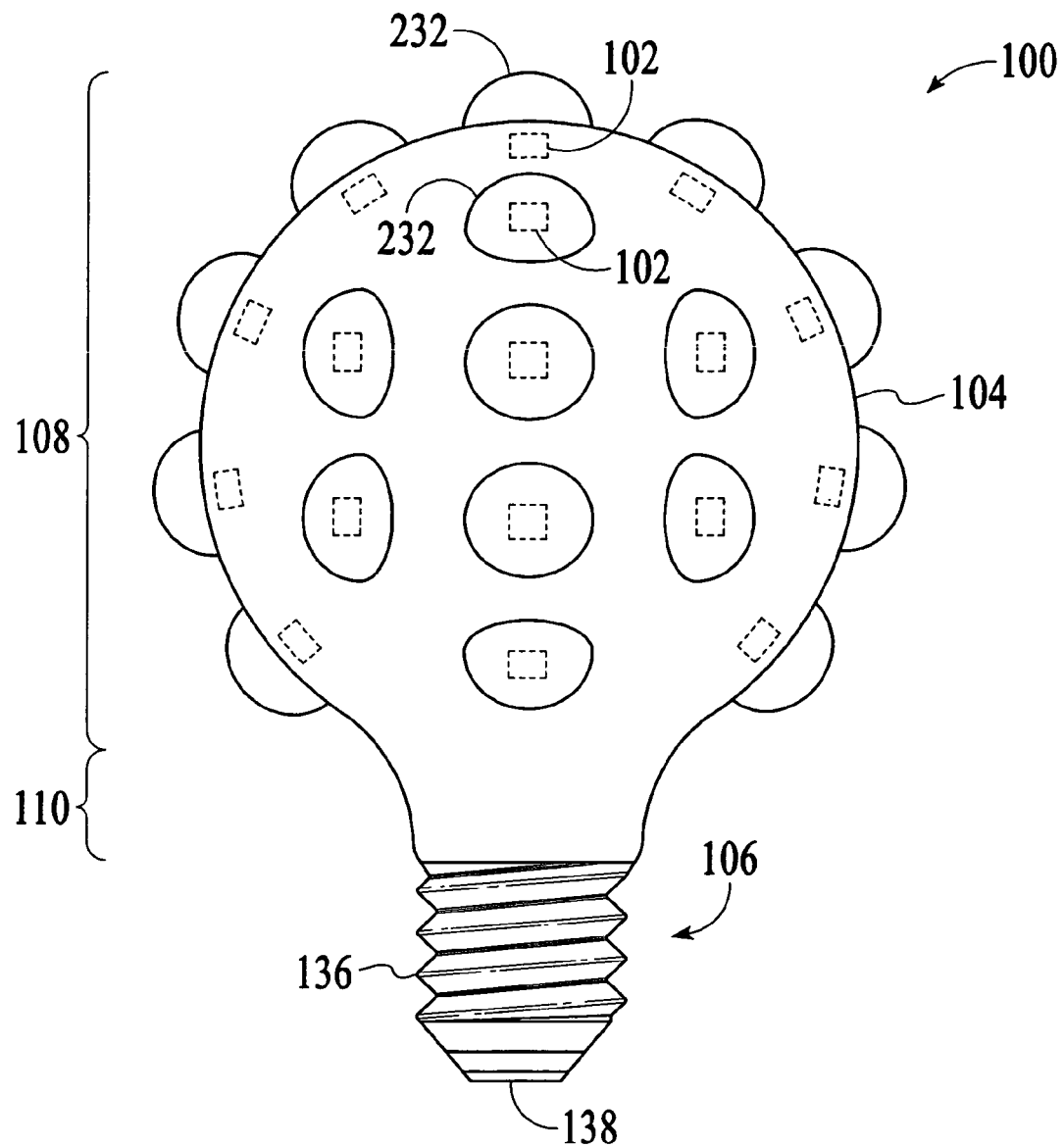
FIG. 1 is a diagram of an illumination device in accordance with an embodiment of the invention.

With reference to FIG. 1, an illumination device 100 in accordance with an embodiment of the invention is described. The illumination device 100 includes a number of light-emitting dies 102, which may be light-emitting diode (LED) dies or laser diodes, to emit light in multiple directions to produce a multi-directional illumination similar to that of conventional incandescent light bulbs. In the embodiment illustrated in FIG. 1, the illumination device 100 is configured to produce a substantially spherical illumination, which provides light in virtually all directions from the illumination device.

Figure 2:
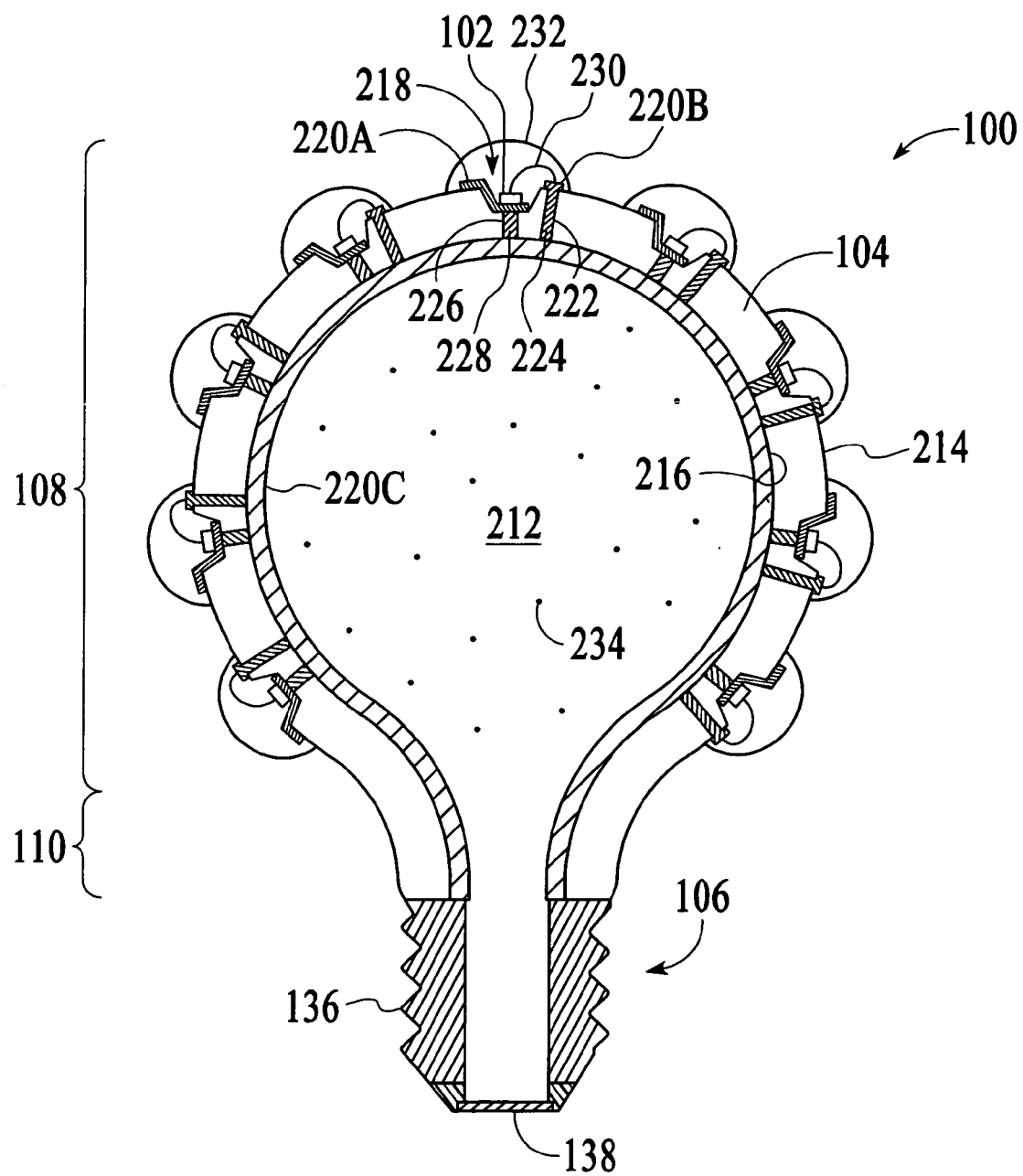
FIG. 2 is a cross-sectional diagram of the illumination device of FIG. 1.

As shown in FIG. 1, the illumination device 100 includes a three-dimensional (3D) substrate 104, the light-emitting dies 102 and a screw cap 106. The 3D substrate 104 is the main structure of the illumination device 100. The 3D substrate 104 is a bulb-shaped structure. In the embodiment illustrated in FIG. 1, the 3D substrate 104 has a shape similar to the glass envelope of a typical incandescent light bulb. Thus, the 3D substrate 104 has a substantially spherical main portion 108 and a taper base portion 110. The 3D substrate 104 is not a solid structure, as illustrated in FIG. 2, which is a cross-sectional view of the illumination device 100. Rather, the 3D substrate 104 is a 3D shell, which defines an interior region 212, which is substantially enclosed by the substrate shell. Thus, the 3D substrate 104 has an exterior surface 214 and an interior surface 216. In this embodiment, the 3D substrate 104 is a glass, or ceramic substrate. However, in other embodiments, the 3D substrate 104 can be made of other material, such as plastic, polymer or liquid crystal polymer (LCP) material. The 3D substrate 104 may be formed of a single integral piece of material or multiple pieces of material that are attached or fused together. In an embodiment in which the 3D substrate 104 is made of glass, the 3D substrate 104 may be two-halves fused into the desired shape.

As shown in FIG. 2, the 3D substrate 104 includes depressions 218 or reflector cups on the exterior surface 214 of the 3D substrate. The reflector cups 218 may have a polished reflective surface or a reflective metallic coating, such as a reflective silver, palladium or gold coating. These reflector cups 218 are located throughout the exterior surface 214 of the 3D substrate 104. In an embodiment, the reflector cups 218 may be equally distributed along longitudinal and latitudinal directions on the exterior surface 214 of the 3D substrate 104. In other embodiments, the reflector cups 218 may be distributed in any arrangement on the exterior surface 214 of the 3D substrate 214. As described in more detail below, the light-emitting dies 102 are mounted in the reflector cups 218 of the 3D substrate 104. Thus, the light-emitting dies 102 are distributed throughout the exterior surface 214 of the 3D substrate 104 to emit light in different directions to provide a substantially spherical illumination.

The 3D substrate 104 includes electrical traces 220 on the exterior surface 214 and the interior surface 216 of the 3D substrate. The electrical traces 220 on the exterior surface 214 of the 3D substrate 104 will sometimes be referred to herein as the overlying electrical traces, while the electrical traces on the interior surface 216 of the 3D substrate 104 will sometimes be referred to herein as the underlying electrical traces. These electrical traces 220 can be made of any electrically conductive material, such as copper or indium tin oxide (ITO), which may be printed, plated or etched on the exterior and interior surfaces 214 and 216 of the 3D substrate 104. Alternatively, these electrical traces 220 may be pre-printed on a glass or polymer "parison" form and later blown into shape. As illustrated in FIG. 3A, which is a more detailed partial view of the exterior surface 214 of the 3D substrate 104, the overlying electrical traces 220 on the exterior surface of the 3D substrate include overlying electrical traces 220A and 220B. As illustrated in FIG. 3A, each of the overlying electrical traces 220A extends into the corresponding reflector cup 218 of the 3D substrate 104 onto the bottom surface of that reflector cup. These overlying electrical traces 220A serve as cathode connections to the light-emitting dies 102 to conduct driving currents through the light-emitting dies, which activate the light-emitting dies to generate light. As illustrated in FIG. 3A, each of the overlying electrical traces 220B extends near the corresponding reflector cup 218 of the 3D substrate 104. These overlying electrical traces 220B serve as anode connections to the light-emitting dies 102 to supply driving currents to the light-emitting dies.

As shown in FIG. 2, the 3D substrate 104 has vias 222 that include electrically conductive material 224. The vias 222 extend completely through the 3D substrate 104 so that the conductive material 224 in the vias 222 can be accessed from both the exterior and interior surfaces 114 and 116 of the 3D substrate. The overlying electrical traces 220A and 220B on the exterior surface 214 of the 3D substrate 104 extend to the vias 222. The conductive material 224 in the vias 222 is used to electrically connect the overlying electrical traces 220A and 220B on the exterior surface 114 of the 3D substrate 104 and the underlying electrical traces 220 on the interior surface 116 of the 3D substrate. The 3D substrate 104 also has thru-holes 226 that include thermally conductive material 228. Each thru-hole 226 is formed in one of the reflector cups 118 and is positioned directly below the light-emitting die 102 mounted in that reflector cup.

The light-emitting dies 102 are mounted in the reflector cups 118 of the 3D substrate 104 on the electrical traces 220A using appropriate adhesive material, which is electrically and thermally conductive. Thus, the light-emitting dies 102 are electrically connected to the overlying cathode electrical traces 220A. The light-emitting dies 102 are also electrically connected to the overlying anode electrical traces 220B via bondwires 230. Since the light-emitting dies 102 are mounted in the reflector cups 118 of the 3D substrate 104, which are distributed throughout the exterior surface 114 of the 3D substrate, the light-emitting dies are similarly distributed on the exterior surface of the 3D substrate. Thus, the light generated by the light-emitting dies 102 radiate in different directions to provide a substantially spherical illumination. The light-emitting dies 102 of the illumination device 100 may include only light-emitting dies configured to generate light of a particular color. Alternatively, the light-emitting dies 102 may include different light-emitting dies configured to generate light of different colors, such as red, green, blue and white.

As shown in FIG. 2, each light-emitting die 102 is encapsulated in a transparent dome 232 formed over the light-emitting die using a transparent material, which can be epoxy, silicone, a hybrid of silicone and epoxy, amorphous polyamide resin or fluorocarbon, glass and/or plastic material. In an embodiment, the transparent encapsulation dome 232 over each light-emitting die 102 encapsulates not only the light-emitting die but also the reflector cup 118 in which the light-emitting die is mounted and the overlying electrical traces 220A and 220B connected to the light-emitting die. The encapsulation dome 232 provides a protective barrier for the encapsulated components of the illumination device 100. The encapsulation dome 232 may also fiction as a lens to optically manipulate the light emitted from the encapsulated light-emitting die 102. In an alternative embodiment, each light-emitting die 102 may be covered by a transparent conformal coating or optical gel (not shown). The transparent conformal coating or the optical gel may also cover the overlying electrical traces 220A and 220B connected to the light-emitting die 102.

The underlying electrical traces 220 on the interior surface 216 of the 3D substrate 104 extend throughout the interior surface and are selectively connected to the electrically conductive material 224 in the vias 222 and the thermally conductive material 228 in the thru-holes 226. As illustrated in FIG. 3B, the underlying electrical traces 220 include "active" electrical traces 220C and 220D. The underlying electrical traces 220C are electrically connected to the overlying cathode electrical traces 220A through the electrically conductive material 224 in the vias 222 that are connected to the overlying "cathode" electrical traces. The underlying electrical traces 220D are electrically connected to the overlying anode electrical traces 220B through the electrically conductive material 224 in the vias 222 that are connected to the overlying anode electrical traces. These underlying electrical traces 220C and 220D may be arranged to form series or parallel circuits to drive the light-emitting dies 102 mounted in the reflector cups 118 of the 3D substrate 104. The underlying electrical traces 220 also include "dummy" traces 220E that are connected to the thermally conductive material 228 in the thru-holes 226 to dissipate the heat generated from the light-emitting dies 102. The "dummy" traces 220E are not connected to conduct electrical current (i.e., only connected to the overlying cathode electrical traces 220A), but rather to conduct heat-from the light-emitting dies 102. In some embodiments, the interior region 212 of the 3D substrate 104 may be filled with a thermally conductive fluid 234 to further dissipate the heat generated from the light-emitting dies 102. The thermally conductive fluid 234 may be an inert gas, such as Argon, Xenon, Freon or Nitrogen, or a liquid, such as deionized water or a liquid gel (silicone). The active underlying electrical traces 220C and 220D are routed to the screw cap 106 down the taper base portion 110 of the 3D substrate 104. In some embodiments, the 3D substrate 104 may include thermally conductive additives, such as Boron Nitride or metal particles, to increase the thermal conductivity of the substrate to dissipate the heat generated from the light-emitting dies 102. In these embodiments, the thermally conductive additives must be electrically insulated from the electrical traces 220 and other electrical connections on the substrate 104.

The screw cap 106 of the illumination device 100 is similar to the screw cap of conventional incandescent light bulbs. The screw cap 106 is configured to fit a bulb socket. The screw cap 106 includes a screw tread contact 136 and an electrical foot contact 138. In an embodiment, the screw tread contact 136 of the screw cap 106 is connected to the underlying electrical traces 220D on the interior surface 216 of the 3D substrate 104, which are connected to the 25 overlying anode electrical traces 220B on the exterior surface 214 of the 3D substrate 104. The electrical foot contact 138 of the screw cap 106 is connected to the underlying electrical traces 220C on the interior surface 216 of the 3D substrate 104, which are connected to the overlying cathode electrical traces 220A on the exterior surface 214 of the 3D substrate 104. Thus, the screw tread contact 136 and the electrical foot contact 138 are electrically connected to the light-emitting dies 102. The screw tread contact 136 and the electrical foot contact 138 of the screw cap 106 can be connected to a power source or a regulator (not shown) to supply the driving current, which is applied to the light-emitting dies 102 to activate the light-emitting dies. In other embodiments, the illumination device 100 may include other types of light bulb caps, such as a bayonet type cap.

In the embodiment illustrated in FIG. 1, the illumination device 100 is similar in shape to a typical incandescent light bulb due to the spherical configuration of the main portion 108 of the 3D substrate 104. However, in other embodiments, the main portion 108 of the 3D substrate 104 may be configured in other ellipsoid shape, such as an oblate or prolate spheroid, or other known glass shape of a conventional light bulb. In an alternative embodiment, the main portion 108 of the 3D substrate 104 may be configured in a half-dome shape, as illustrated in FIG. 4. In other alternative embodiments, the main portion 108 of the 3D substrate 104 may be configured in a polyhedral shape (not shown), such as a decahedral or octahedral shape.

Figure 5:
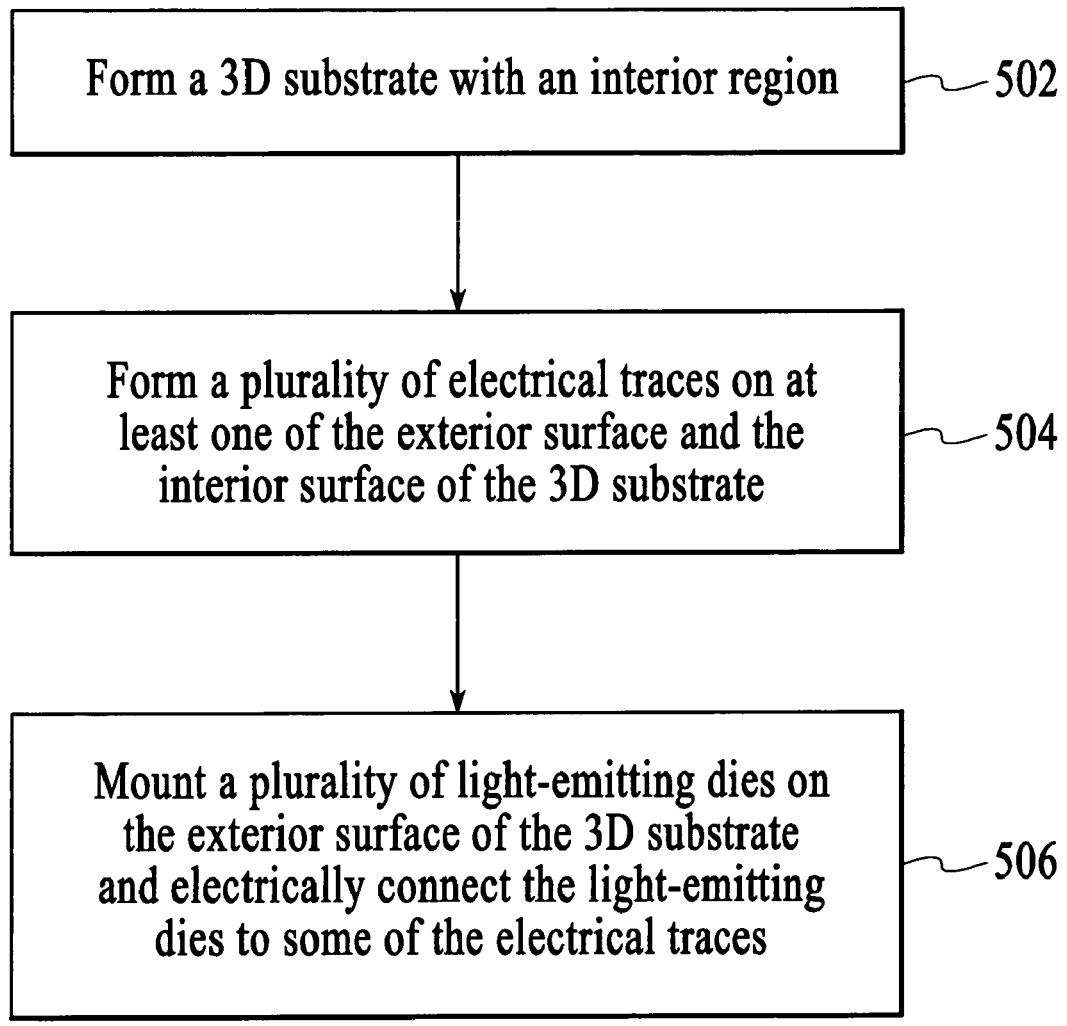
FIG. 5 is a flow diagram of a method of making an illumination device in accordance with an embodiment of the invention.

A method for making an illumination device in accordance with an embodiment of the invention is described with reference to FIG. 5. At block 502, a is 3D substrate with an interior region is formed. At block 504, a plurality of electrical traces is formed on at least one of the exterior surface and the interior surface of the 3D substrate. At block 506, a plurality of light-emitting dies is mounted on the exterior surface of the 3D substrate. Furthermore, at block 506, the light-emitting dies are electrically connected to some of the electrical traces.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An illumination device comprising:
   a rigid three-dimensional substrate configured to define an interior region, said three-dimensional substrate having an exterior surface and having an interior surface;
   a plurality of electrical traces on at least said interior surface, said electrical traces configured to transmit driving signals;
   a plurality of light-emitting dies mounted on said exterior surface of said three-dimensional substrate and connected to some of said electrical traces, said light-emitting dies being configured to generate light when driving signals are applied to said light-emitting dies through said electrical traces; said three-dimensional substrate includes thru-holes with thermally conductive material therein, each of said thru-holes being positioned directly below one of said light-emitting dies; said three-dimensional substrate includes reflector cups on said exterior surface of said three-dimensional substrate, said light-emitting dies being mounted in said reflector cups; and said interior region being substantially entirely filled with a fluid interfacing with said interior surface and said traces thereon.

2. The illumination device of claim 1 wherein said three-dimensional substrate is one of a glass substrate and a ceramic substrate.

3. The illumination device of claim 1 wherein said electrical traces includes overlying electrical traces on said exterior surface of said three-dimensional substrate and underlying electrical traces on said interior surface of said three-dimensional substrate, and wherein said three-dimensional substrate includes vias with electrically conductive material therein to electrically connect said overlying electrical traces and said underlying electrical traces.

4. The illumination device of claim 1 wherein said three-dimensional substrate includes a substantially spherical portion on which said light-emitting dies are mounted.

5. The illumination device of claim 1 wherein said three-dimensional substrate includes a half-dome shaped portion on which said light-emitting dies are mounted.

6. The illumination device of claim 1, said fluid interfacing with said interior surface and said traces thereon comprising a thermally conductive fluid.

7. The illumination device of claim 1 wherein said electrical traces are made of indium tin oxide (ITO) or copper.

8. The illumination device of claim 1 wherein said three-dimensional substrate includes thermally conductive additives.

9. A method of making an illumination device, said method comprising:
   forming a three-dimensional substrate with an interior region, said three-dimensional substrate having an exterior surface and an interior surface;
   forming a plurality of electrical traces on at least said interior surface, said electrical traces configured to transmit driving signals;
   mounting a plurality of light-emitting dies on said exterior surface of said three-dimensional substrate, including electrically connecting said light-emitting dies to some of said electrical traces; forming said three-dimensional substrate includes forming thru-holes with thermally conductive material therein, positioning each of said thru-holes directly below one of said light-emitting dies; forming said three-dimensional substrate includes reflector cups on said exterior surface of said three-dimensional substrate; mounting said light-emitting dies in said reflector cups; and
   substantially entirely filing the interior region with a fluid that interfaces with the interior surface of the three dimensional substrate and said traces formed thereon.

10. The method of claim 9 wherein said forming said three-dimensional substrate includes forming one of a three-dimensional glass substrate and a three-dimensional ceramic substrate.

11. The method of claim 9 wherein said forming said three-dimensional substrate includes creating vias in said three-dimensional substrate, and wherein said forming said plurality of electrical traces includes forming overlying electrical traces on said exterior surface of said three-dimensional substrate and underlying electrical traces on said interior surface of said three-dimensional substrate that are electrically connected using electrically conductive material in said vias.

12. The method of claim 9 wherein said forming said three-dimensional substrate includes creating thru-holes in said three-dimensional substrate, and wherein said mounting said plurality of light-emitting dies includes mounting each of said plurality of light-emitting dies on said exterior surface of said three-dimensional substrate directly over one of said thru-holes.

13. The method of claim 9 wherein said forming said three-dimensional substrate includes forming said three-dimensional substrate that includes a substantially spherical portion on which said light-emitting dies are mounted.

14. The method of claim 9 wherein said forming said three-dimensional substrate includes forming said three-dimensional substrate that includes a half-dome shaped portion on which said light-emitting dies are mounted.

15. The method of claim 9 wherein said forming said three-dimensional substrate includes creating reflector cups on said exterior surface of said three-dimensional substrate, said light-emitting dies being mounted in said reflector cups.

16. The method of claim 9, said substantially entirely filing the interior region with a fluid comprising inserting a thermally conductive fluid in said interior region of said three-dimensional substrate.

17. An illumination device comprising:

a bulb member shaped like a conventional incandescent light bulb and having an interior surface and an exterior surface;

a screw cap, shaped like the screw cap of a conventional incandescent light bulb and configured to fit a conventional light bulb socket, mounted on said bulb member;

said bulb member having an interior cavity which is defined by said interior surface of said bulb member; said interior cavity having an opening which is covered by said screw cap;

a plurality of electrical traces on at least said interior surface of said bulb member, said electrical traces configured to transmit driving signals;

a plurality of light-emitting dies mounted on said exterior surface of said bulb member and connected to some of said electrical traces, said light-emitting dies being configured to generate light when driving signals are applied to said light-emitting dies through said electrical traces; said three-dimensional substrate includes thru-holes with thermally conductive material therein, each of said thru-holes being positioned directly below one of said light-emitting dies; said three-dimensional substrate includes reflector cups on said exterior surface of said three-dimensional substrate, said light-emitting dies being mounted in said reflector cups.

* * * * *